(12) United States Patent
Forbes et al.

(10) Patent No.: US 7,235,837 B2
(45) Date of Patent: *Jun. 26, 2007

(54) TECHNIQUE TO CONTROL TUNNELING CURRENTS IN DRAM CAPACITORS, CELLS, AND DEVICES

(75) Inventors: Leonard Forbes, Corvallis, OR (US); Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/267,009

(22) Filed: Nov. 4, 2005

(65) Prior Publication Data

US 2006/0054956 A1    Mar. 16, 2006

Related U.S. Application Data

(60) Continuation of application No. 10/721,585, filed on Nov. 25, 2003, now Pat. No. 6,979,607, which is a division of application No. 09/945,310, filed on Aug. 30, 2001, now Pat. No. 6,664,589.

(51) Int. Cl.
*H01L 27/108* (2006.01)
(52) U.S. Cl. ............... 257/297; 257/407; 257/E49.003; 257/E27.081
(58) Field of Classification Search ........... 257/328, 257/E27.081, E29.128, 297, 296, 407, 412, 257/321, E49.002
See application file for complete search history.

(56) References Cited

U.S. PATENT DOCUMENTS

| | | | |
|---|---|---|---|
| 3,387,286 A | 6/1968 | Dennard | |
| 5,408,115 A | 4/1995 | Chang | |
| 5,530,581 A | 6/1996 | Cogan | |
| 5,852,311 A | 12/1998 | Kwon et al. | |
| 5,869,370 A | 2/1999 | Chuang et al. | |
| 5,886,368 A | 3/1999 | Forbes et al. | |
| 5,989,958 A | 11/1999 | Forbes | |
| 6,031,263 A | 2/2000 | Forbes et al. | |
| 6,245,613 B1 | 6/2001 | Hsu et al. | |
| 6,246,089 B1 | 6/2001 | Lin et al. | |
| 6,249,460 B1 | 6/2001 | Forbes et al. | |
| 6,265,266 B1 | 7/2001 | Dejenfelt et al. | |
| 6,278,155 B1 | 8/2001 | Okabe et al. | |
| 6,294,420 B1 * | 9/2001 | Tsu et al. | 438/239 |
| 6,316,316 B1 | 11/2001 | Wu | |
| 6,351,428 B2 | 2/2002 | Forbes | |
| 6,376,302 B1 * | 4/2002 | Choi | 438/253 |
| 6,383,939 B1 | 5/2002 | Yang et al. | |

(Continued)

OTHER PUBLICATIONS

"Silicon Monoxide", *CERAC, inc.-Silicon Monoxide*, SIO, (2000),pp. 1-4.

(Continued)

*Primary Examiner*—Caridad Everhart
(74) *Attorney, Agent, or Firm*—Schwegman, Lundberg, Woessner & Kluth, P.A.

(57) ABSTRACT

Structures and methods are provided for the use with PMOS devices. Materials with large electron affinities or work functions are provided for structures such as gates. A memory cell is provided that utilizes materials with work functions larger than n-type doped polysilicon (4.1 eV) or aluminum metal (4.1 eV) for gates or capacitor plates.

43 Claims, 7 Drawing Sheets

U.S. PATENT DOCUMENTS

| | | | |
|---|---|---|---|
| 6,384,448 B1 | 5/2002 | Forbes | |
| 6,411,160 B1 | 6/2002 | Riho et al. | |
| 6,441,423 B1* | 8/2002 | Mandelman et al. | 257/301 |
| 6,456,535 B2 | 9/2002 | Forbes et al. | |
| 6,515,328 B1 | 2/2003 | Yang et al. | |
| 6,583,011 B1 | 6/2003 | Xia et al. | |
| 6,639,835 B2 | 10/2003 | Forbes | |
| 6,664,589 B2* | 12/2003 | Forbes et al. | 257/328 |
| 6,730,960 B2 | 5/2004 | Forbes | |
| 2002/0016081 A1 | 2/2002 | Aloni et al. | |
| 2003/0001197 A1 | 1/2003 | Chang et al. | |
| 2003/0011009 A1 | 1/2003 | Zhang et al. | |
| 2003/0201491 A1 | 10/2003 | Chung | |

OTHER PUBLICATIONS

Al-Ani, S.K.J. , et al., "The Effect of Temperature of the Optical Absorption Edge of Amorphous Thin Films of Silicon Monoxide", *Phys. Stat. Sol.(b)* 123, (1984),653-658.

Al-Ani, S.K.J. , et al., "The optical absorption edge of amorphous thin films of silicon monoxide", *Journal of Materials Science*, 19, (1984), 1737-1748.

Chand, N. , et al., "Tunability of intrinsic stress $SiO_x$/dielectric films formed by molecular beam deposition", *IEE*, (1995),2 pages.

Chau, R. , et al., "30nm Physical Gate Length CMOS Tansistors with 1.0 ps n-MOS and 1.7 ps p-MOS Gate Delays", *IEEE Int. Electron, Devices Meeting*, San Francisco, (Dec. 2000),pp. 45-48.

Demichelis, F. , et al., "Doped amorphous and microcrystalline silicon carbide as wide band-gap material", *Wide Band Gap Semiconducors Symposium, Mat. Res. Soc.*, Pittsburgh, PA, (1992), 1 page.

Eldridge, J. M., et al., "Oxidation of Plasma-Deposited a-$SixC1-x$: H films", *J. Electrochem. Soc.*, vol. 137, No. 7, (Jul. 1990),pp. 2266-2271.

Furusawa, T. , et al., "Simple, Reliable Cu/low-k Interconnect Integration Using Mechanically-strong Low-k Dielectric Material: Silicon-oxycarbide", *Proc. IEEE Int. Interconnect Technology Conf.*, (Jun. 2000),pp. 222-224.

Hirayama, M. , et al., "Low-Temperature Growth of High-Integrity Silicon Oxide Films by Oxygen Radical Generated in High-Density Krypton Plasma", *IEEE*, (1999),4 pages.

Ilyas, M. , et al., "The optical absorption edge of amorphous thin films of silicon monoxide and of silicon monoxide mixed with titanium monoxide", *IEEE*, (2001),1 page.

Kubaschewski, O. , et al., "Oxidation of Metals and Alloys", *Butterworths*, London, (1962),pp. 53-64.

Maiti, B. , et al., "Metal Gates for Advanced CMOS Technology", *Proc, Microelectronic Device Technology III*, Santa Clara, CA, 22-23 , Soc. of Photo-Optical Instrumentation Engineers, Bellingham WA,(Sep. 1999),pp. 46-57.

Renlund, G. M., "Silicon oxycarbide glasses: Part I. Preparation and chemistry", *J. Mater, Res.*, (Dec. 1991),pp. 2716-2722.

Renlund, G. M., "Silicon oxycarbide glasses: Part II. Structure and properties", *J. Mater. Res.*, vol. 6, No. 12,(Dec. 1991),pp. 2723-2734.

Robinson, G. , "Passivation hardens lasers for low-cost package", 3 pages.

Shi, Y. , et al., "Tunneling Leakage Current in Ultrathin (less than 4nm) Nitride/Oxide Stack Dielectrics", *IEEE Electron Device Letters*, 19(10), (Oct. 1998),pp. 388-390.

Skriver, H. L., et al., "Surface energy and work function of elemental metals", *Physical Review B (Condensed Matter)*, vol. 46, No. 11, (Sep. 15, 1992), 1 page.

Strass, A. , et al., "Fabrication and Characterisation of thin low-temperature MBE-compatible silicon oxides of different stoichiometry", *Thin Solid Films 349*, (1999),pp. 135-146.

Sze, S. M., "Physics of Semiconductor Devices", New York, *Wiley-Interscience*, ISBN: 0471842907,(1969),402-407.

Sze, S. M., "Physics of Semiconductor Devices,", *Wiley*, (1981),pp. 251, 396.

* cited by examiner

TECHNIQUE TO CONTROL TUNNELING CURRENTS IN DRAM CAPACITORS, CELLS, AND DEVICES

CROSS-REFERENCE TO RELATED APPLICATIONS

This application is a continuation of U.S. application Ser. No. 10/721,585, filed Nov. 25, 2003 now U.S. Pat. No. 6,979,607; which is a divisional of U.S. application Ser. No. 09/945,310, filed Aug. 30, 2001, now issued as U.S. Pat. No. 6,664,589; each of which is incorporated herein by reference.

This application is related to the following commonly assigned U.S. patent applications: L. Forbes, "P-CHANNEL DYNAMIC FLASH MEMORY CELLS WITH ULTRATHIN TUNNEL OXIDES," Ser. No. 09/514,627, filed Feb. 28, 2000, now issued as U.S. Pat. No. 6,384,448; L. Forbes, "STATIC NVRAM MEMORY CELL WITH ULTRATHIN ULTRA THIN TUNNEL OXIDES," Ser. No. 09/515,630, filed Feb. 29, 2000, now issued as U.S. Pat. No. 6,639,835; L. Forbes and K. Y. Ahn, "LOW VOLTAGE FIELD (IN SYSTEM) PROGRAMMABLE LOGIC ARRAY PLA'S WITH ULTRATHIN TUNNEL OXIDES," Ser. No. 09/515,759, filed Feb. 29, 2000, now issued as U.S. Pat. No. 6,605,961; L. Forbes and k. Y. Ahn, "LOW VOLTAGE PROGRAMMABLE LOW VOLTAGE MEMORY ADDRESS AND DECODE CIRCUITS WITH ULTRATHIN TUNNEL OXIDES FOR FAULT CORRECTION," Ser. No. 09/515,115, filed Feb. 20, 2000, now issued as U.S. Pat. No. 6,351,428; each of which disclosure is herein incorporated by reference.

FIELD OF THE INVENTION

The present invention relates generally to integrated circuits, and in particular to techniques to control tunneling currents in DRAM capacitors, cells, and devices.

BACKGROUND OF THE INVENTION

Field-effect transistors (FETS) are typically produced using a standard complementary metal-oxide-semiconductor (CMOS) integrated circuit fabrication process. As is well known in the art, such a process allows a high degree of integration such that a high circuit density can be obtained with the use of relatively few well-established masking and processing steps. A standard CMOS process is typically used to fabricate FETs that each have a gate electrode that is composed of —type conductively doped polycrystalline silicon (polysilicon) material or other conductive materials.

The modern memory cell is composed of one transistor, such as the above described FET, and one capacitor. This modern form of the memory cell is referred to as dynamic random access memory (DRAM). In a DRAM, stored charge on the capacitor represents represent a binary one or zero while the transistor, or FET, acts as the switch interposed between the bit line or digit line and capacitor. The capacitor array plate or common node is typically charged to Vcc/2 (Vcc also written as Vdd), and therefore the charge stored on the capacitor for logic 1 is q=C*Vcc/2 and for a logic zero the stored charge is q=-C*Vcc/2 the charge is negative with respect to Vcc/2 common node voltage. The bit line or digit line connects to a multitude of transistors. The gate of the access transistor is connected to a word or row line. The wordline connects to a multitude of transistors.

In conventional DRAMS using NMOS access transistors, the transmission of a 1 or Vcc in writing a 1 into the capacitor (i.e., charging the capacitor to Vcc, though the total voltage across the capacitor is Vcc/2 as the array plate is kept at Vcc/2) is degraded unless a gate voltage higher than Vcc or Vdd is used. If the gate voltage was just kept at Vdd or Vcc the amount of voltage on the capacitor plate connected to the transistor would only be Vdd–Vtn (where Vtn is the threshold voltage). Using an n-channel access devices requires the gate voltage of the n-channel transistor be raised to Vdd+Vtn where Vtn is the threshold voltage of the NMOS transistor. This will allow the capacitor plate to see a full Vdd, e.g. [(Vdd+Vtn)–Vtn]=Vdd. Similarly for the PMOS access transistors the transmission of a zero or Vss is degraded, and the voltage of the PMOS gate has to be lowered to Vss–Vtp. The preferred voltage applied to the gate of the PMOS device when turned on in this invention is –Vtp, or more negative than Vtp. Applying this voltage to the PMOS transistor turns it on and therefore a 1 or a 0 can be written into the capacitor. If the plate connected to the PMOS is charged to Vcc or Vdd then the capacitor stores a 1, and if the plate connected to the PMOS is charged Vss then the capacitor stores a 0. Normally the array plate of the capacitor is tied to Vcc/2 and the voltage across the capacitor is Vcc/2.

The use of PMOS devices in DRAM memory cells is in itself not new, in fact the original patent (U.S. Pat. No. 3,387,286 "FIELD EFFECT TRANSISTOR MEMORY," R. H. Dennard, 4 Jun. 1968) described both the use of NMOS and PMOS devices. In 1970, the newly formed Intel Company publicly released the 1103, the first DRAM (Dynamic Random Access Memory) chip (1K bit PMOS dynamic RAM ICs), and by 1972 it was the best selling semiconductor memory chip in the world, defeating magnetic core type memory. The first commercially available computer using the 1103 was the HP 9800 series. These devices however were based on an old technology with gate oxides in the range of 1000 angstroms, 0.1 micron, or 100 nm. PMOS devices were used because of the normally accumulated surface on n-type wafers, techniques had not yet been fully developed to control the surface inversion in the field regions of p-type wafers. With such thick gate insulators and capacitor dielectrics there was and is little consideration and concern about tunneling leakage currents.

With the development of the LOCOS process and field implantations to control surface inversion on p-type wafers the industry changed to NMOS technology and then CMOS technology on p-type wafers. Subsequent developments and scaling of devices to below 0.1 micron, or 100 nm, dimensions have resulted in the use of ultrathin gate oxides and capacitor dielectric insulators, as low as 12 angstroms, or 1.2 nm. Such ultrathin insulators can result in large tunneling currents, in the case of silicon oxide as large as 1.0 A/cm$^2$ (S. M. Sze, "Physics of semiconductor devices," Wiley, N.Y., 1981, pp. 402–407; T. P. Ma et al., "Tunneling leakage current in ultrathin (<4 nm) nitride/oxide stack dielectrics," IEEE Electron Device Letters, vol. 19, no. 10, pp. 388–390, 1998). While such leakage or tunneling currents may not cause faults in microprocessors and logic circuits (R. Chau et al., "30 nm physical gate length CMOS transistors with 1.0 ps n-MOS and 1.7 ps p-MOS gate delays," IEEE Int. Electron, Devices Meeting, San Francisco, pp. 45–48, December 2000) they are intolerable in DRAM devices, capacitors and cells.

FIG. 1A, illustrates a conventional DRAM cell 100. As shown in FIG. 1A, the conventional DRAM cell includes a transistor 101 and a capacitor cell 102. A gate 103 for the transistor 101 is separated from the channel 104 of the transistor 100 by an insulator 106, such as an oxide. The channel region 104 of the transistor separates a source region, or first source/drain region 108 from a drain region, or second source/drain region 110. As shown in FIG. 1A, the drain region 110 is coupled to a first plate or capacitor plate 112 of the capacitor cell 102. A second plate, or array plate 114 of the capacitor cell 102 is coupled to Vdd/2. As stated above, these cells depend upon charge storage on capacitance nodes. FIG. 1A illustrates tunneling currents which are leakage currents that will discharge the cells resulting in shortened retention times and/or lost data and faults. FIG. 1A further illustrates that a cause of leakage currents is tunneling from the source/drain of the transfer device which is connected to the capacitor plate to the gate of the transistor when the transistor is off.

As illustrated in FIG. 1B, if a zero is stored in the capacitor cell 102, then the drain 110 of the transistor will be at zero or ground potential, but the gate 103 of the transistor when turned off will be a potential Vdd. This results in a large positive potential between the source/drain at ground, e.g. drain 110 and the gate 103 at potential +Vdd which can result in tunneling leakage currents. These leakage currents would tend to make the capacitor electrode more positive and can result in data errors.

Also, tunneling leakage currents from the gate 103 to substrate/channel 104 when the transistor 101 is turned on with a large negative gate 103 to source 108 voltage will result in excessive gate currents. While the tunneling current of one gate 103 may be very small, modern DRAM arrays have a large number of capacitor cells 102 and transfer devices 101. Summed over an entire array, this leakage current, which may be up to 1 A/cm$^2$, will result in excessive power supply currents and power dissipation.

Therefore, there is a need in the art to provide improved techniques for controlling tunneling currents in DRAM capacitors, cells and devices. Such improved techniques should take into power supply currents and power dissipation issues.

SUMMARY OF THE INVENTION

The above mentioned problems with tunneling leakage currents in DRAM capacitors, cells and devices, as well as the power supply current and power dissipation issues are addressed by the present invention and will be understood by reading and studying the following specification. This disclosure describes the use of PMOS devices, with p-type polysilicon gates or metal gates with large electron affinities or work functions as transfer devices in DRAM cells and the use of p-type polysilicon plates or metal plates with large electron affinities or work functions in DRAM capacitor storage cells. The much larger tunneling barriers in these devices (at least 1.2 eV larger) than in the conventional NMOS devices and capacitor plates doped n-type will result in tunneling currents which are orders of magnitude smaller at the same electric fields across the gate and/or capacitor insulators. In fact the larger barriers and lower operating voltages will preclude Fowler-Nordhiem (F-N) tunneling and the primary tunneling mechanism will be limited to direct band to band tunneling.

In one embodiment of the present invention a novel memory cell is provided. The novel memory cell includes a PMOS transistor. The PMOS transistor includes a first source/drain region and a second source/drain region separated by a channel region. The first and the second source/drain region include source/drain regions having a large work function. The PMOS transistor has a gate opposing the channel region and separated therefrom by a gate insulator. The gate includes a gate having a large work function. The memory cell further includes a storage device, or capacitor, coupled to the second source/drain region. The capacitor includes a first storage node and a second storage node. At least one of the first and the second storage nodes includes a storage node having a large work function.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The following detailed description is not to be taken in a limiting sense, and the scope of the present invention is defined only by the appended claims.

In the past we have disclosed the use of this direct band to band tunneling current in PMOS devices for flash memory type devices and cells (L. Forbes, "P-CHANNEL DYNAMIC FLASH MEMORY CELLS WITH ULTRATHIN TUNNEL OXIDES," Ser. No. 09/514,627, filed Feb. 28, 2000, now U.S. Pat. No. 6,384,448; L. Forbes, "STATIC NVRAM MEMORY CELL WITH ULTRA THIN TUNNEL OXIDES," Ser. No. 09/515,630, filed Feb. 29, 2000, now U.S. Pat. No. 6,639,835; L. Forbes and K. Y. Ahn, "LOW VOLTAGE PLA'S WITH ULTRATHIN TUNNEL OXIDES," Ser. No. 09/515,759, filed Feb. 29, 2000, now U.S. Pat. No. 6,605,961; L. Forbes and K. Y. Ahn, "PROGRAMMABLE LOW VOLTAGE MEMORY ADDRESS AND DECODE CIRCUITS WITH ULTRATHIN TUNNEL OXIDES," Ser. No. 09/515,115, filed Feb. 20, 2000, now U.S. Pat. No. 6,351,428), the intent there being to increase the endurance of flash memory type cells since direct band to band tunneling will not result in electron collisions in the oxide and damage to the oxide as occurs in F-N tunneling.

Figure 1A:
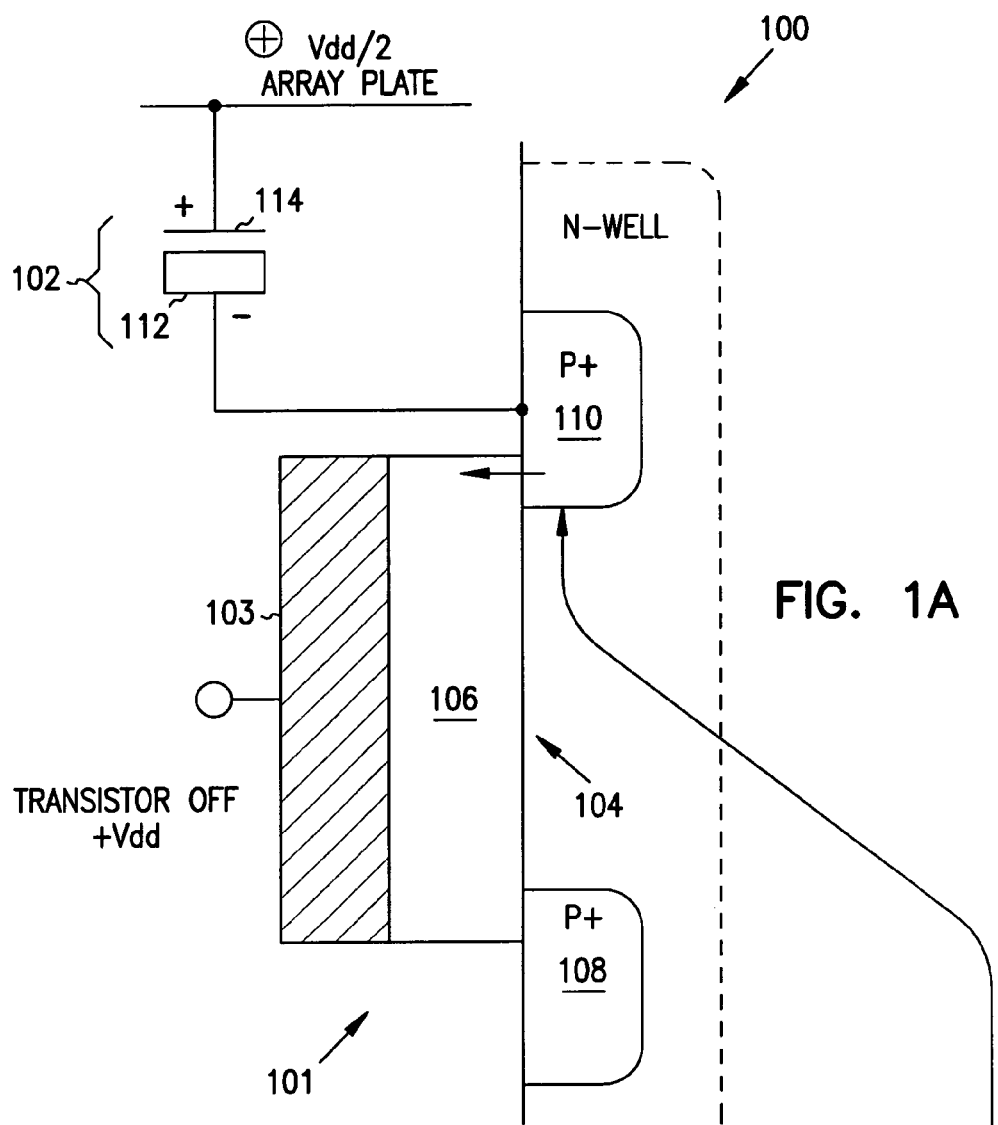
FIGS. 1A–1B, illustrate a conventional DRAM cell.
Figure 1B:
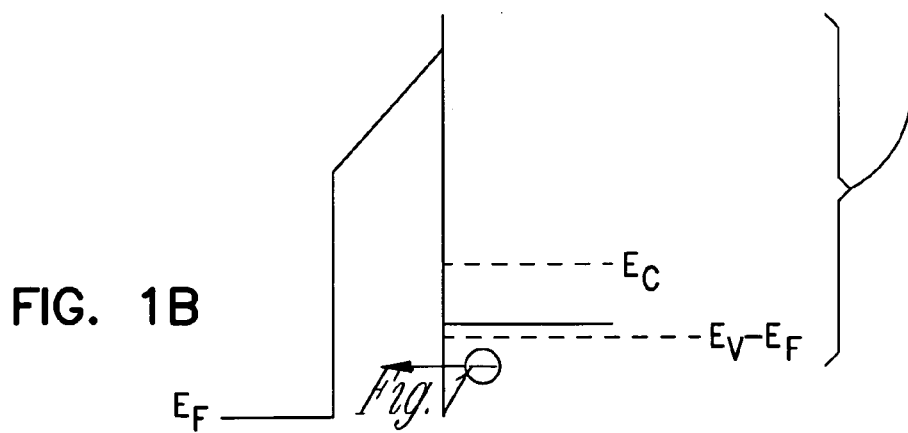
Figure 2:
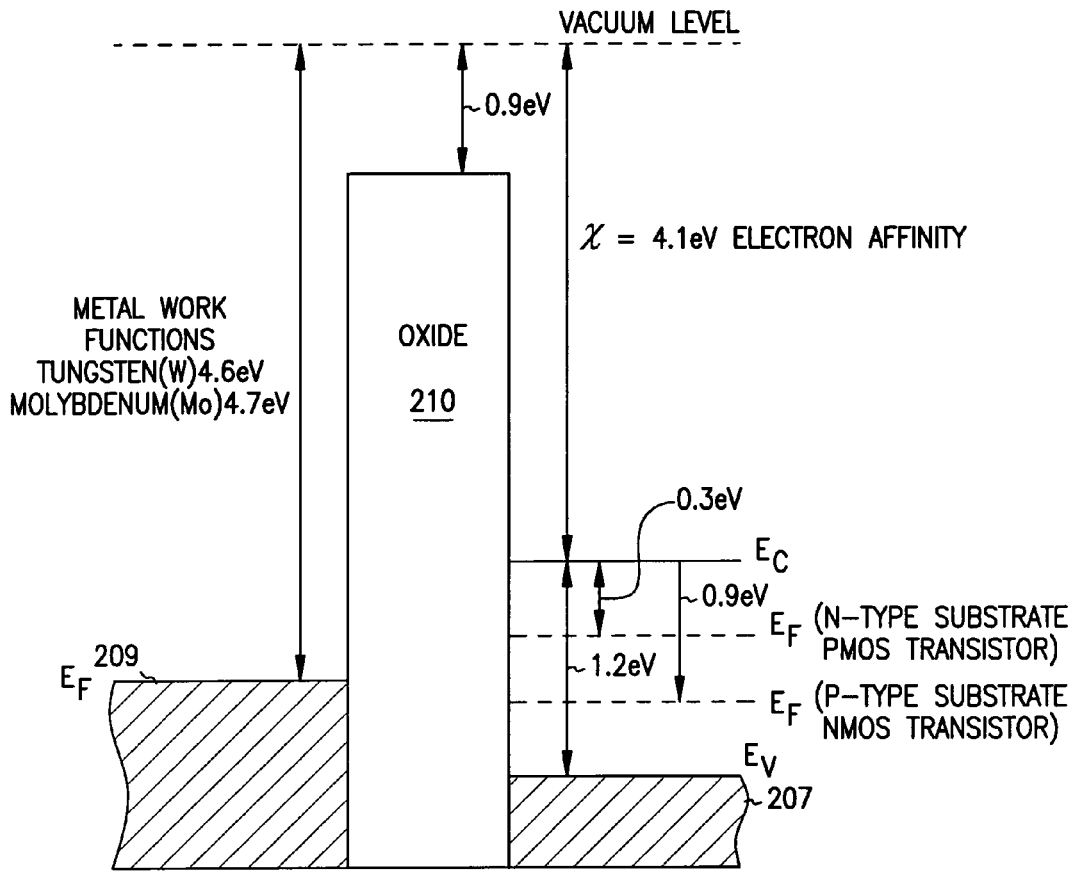
FIG. 2 is an energy band diagram illustrating the "midgap" metals used for optimizing NMOS and PMOS transistor threshold voltages according to the prior art.

Prior art in the use of metals with work functions larger than aluminum or n-type polysilicon have been directed at so called "mid-gap" work functions which make the threshold voltages for both NMOS and PMOS devices symmetrical (see generally, B. Maiti and P. J. Tobin, "Metal gates for advanced CMOS technology," Proc. Microelectronics Device Technology III, Santa Clara, Calif., 22–23 September, 1999, Soc. of Photo-Optical Instrumentation Engineers, Bellingham Wash., pp. 46–57) or the same magnitude or numeric value. This is illustrated in FIG. 2 showing the position of the Fermi level in the metal falling in the center of the silicon bandgap with no potential difference across the gate insulator. Common mid-gap metal work functions are provided by the refractory metals tungsten, W, and molybdenum, Mo.

FIG. 2 is an energy band diagram illustrating the "mid-gap" metals used for optimizing NMOS and PMOS transistor threshold voltages according to the prior art. FIG. 2 is used to illustrate a metal gate 209, such as Tungsten W (work function 4.6 eV) or Molybdenum Mo (work function 4.7 eV) in a DRAM cell separated by an oxide 201 from a channel region 207 in either an n-type (PMOS transistor) or a p-type (NMOS transistor) substrate. As shown in FIG. 2, the metal/semiconductor work function differences can be expressed as follows. For NMOS devices 4.7V−5.0 eV=−0.3 eV, for PMOS devices 4.7−4.4 eV=+0.3 eV. FIG. 2 illustrates the position of the Fermi level in the metal falling in the center of the silicon bandgap with no potential difference across the gate insulator. As stated above, common mid-gap metal work functions are provided by the refractory metals tungsten, W, and molybdenum, MO. However, these prior art techniques still do not solve the problem of low leakage current, which may be up to 1 A/cm$^2$, and will result in excessive power supply currents and power dissipation.

In the present invention, the intent is to utilize the larger tunneling barriers and lower voltages than used in flash memory devices to limit these tunneling leakage currents to levels which are acceptable in DRAM devices, cells and capacitors.

Figure 3A:
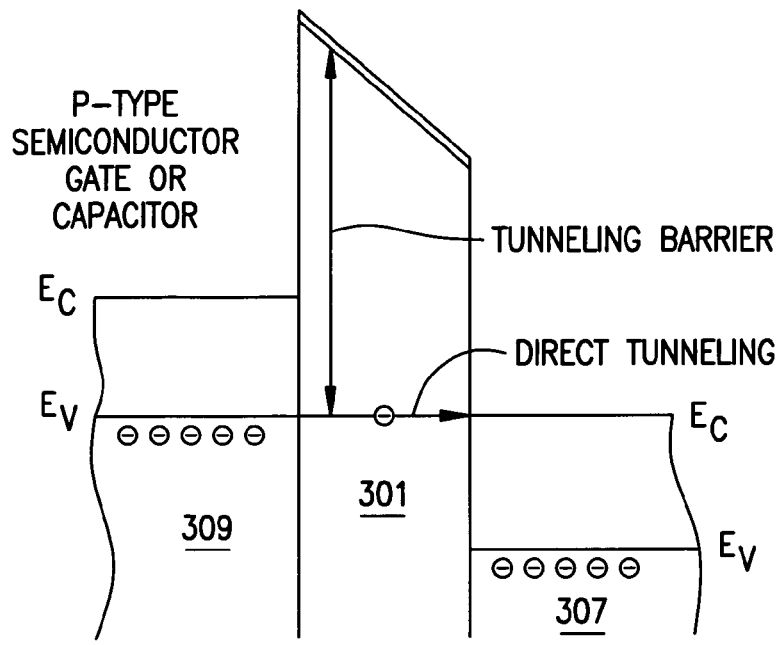
FIG. 3A is an energy band diagram illustrating direct band to band tunneling with low voltages across the gate oxides or gate insulators in conjunction with a p-type semiconductor gate or p-type capacitor storage nodes having large electron affinities or work functions according to the teachings of the present invention.

FIG. 3A is an energy band diagram illustrating direct band to band tunneling with low voltages across the gate oxides or gate insulators in conjunction with a p-type semiconductor gate or p-type capacitor storage nodes 309 having large electron affinities or work functions according to the teachings of the present invention. FIG. 3A illustrates a p-type semiconductor gate or capacitor storage node/plate 309 separated by an insulator, e.g. an oxide 301, from a channel region/substrate 307 or second capacitor storage node/plate 307. According to the teachings of the present invention, the p-type semiconductor gate or capacitor 309 includes polycrystalline semiconductor plates selected from the group consisting of p-doped silicon, p-doped germanium, p-doped silicon germanium compounds, p-doped silicon carbide, p-doped silicon oxycarbide compounds, p-doped gallium nitride compounds, and p-doped gallium aluminum nitride compounds. According to the teachings of the present invention, the tunneling barriers in the structure of FIG. 3A are much larger than in conventional NMOS devices and capacitor plates doped n-type. As one of ordinary skill in the art will understand upon reading this disclosure, these much larger tunneling barriers will result in tunneling currents which are orders of magnitude smaller at the same electric fields across the gate and/or capacitor insulators 301.

In fact, according to the teachings of the present invention, the larger barriers and lower operating voltages will preclude Fowler-Nordheim (F-N) tunneling and the primary tunneling mechanism will be limited to direct band-to-band tunneling.

As discussed above, a number of previous works by the current inventors have disclosed the use of direct band-to-band tunneling current in PMOS devices for flash memory type devices and cells. However, there the intent was to increase the endurance of flash memory type cells since direct band-to-band tunneling will not result in electron collisions in the oxide and damage to the oxide as occurs in F-N tunneling. FIG. 3A illustrates the direct band-to-band tunneling with low voltages across the gate oxides or gate insulators 301.

In the present invention, the intent is to use the larger tunneling barriers and lower voltages than used in flash memory devices to limit these tunneling leakage currents to levels which are acceptable in DRAM devices, cells and capacitors.

Figure 3B:
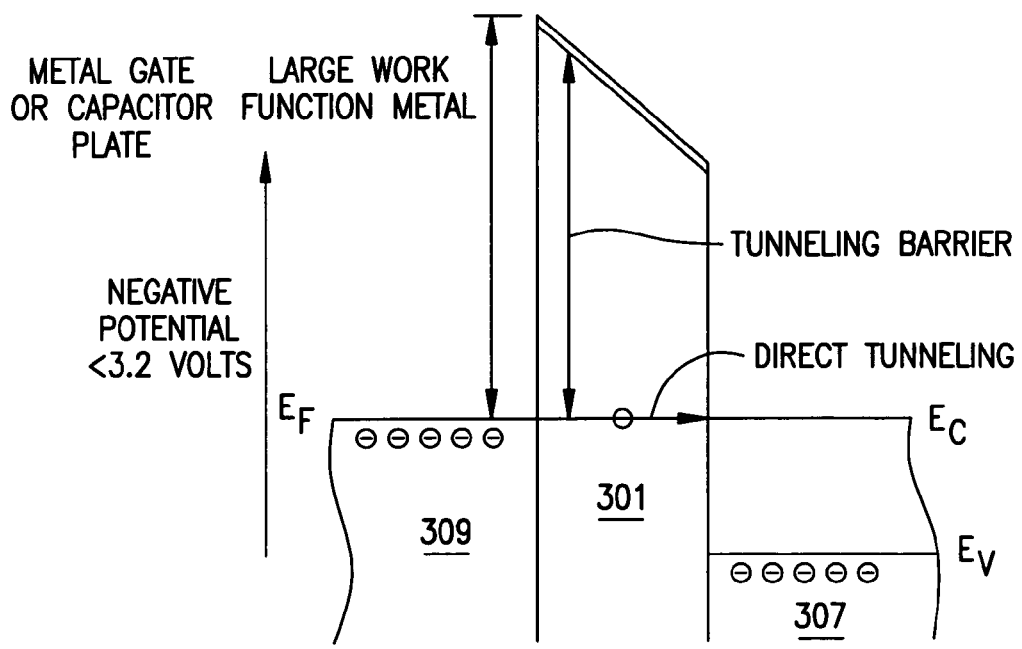
FIG. 3B is an energy band diagram illustrating direct band to band tunneling with low voltages across the gate oxides or gate insulators in conjunction with metal gate or metal capacitor storage nodes having large work functions according to another embodiment of the present invention.

FIG. 3B is an energy band diagram illustrating direct band to band tunneling with low voltages across the gate oxides or gate insulators in conjunction with metal gate or metal capacitor storage nodes having large work functions according to another embodiment of the present invention. FIG. 3B illustrates a metal gate or metal capacitor storage node/plate 309 separated by an insulator, e.g. an oxide 301, from a channel region/substrate 307 or second capacitor storage node/plate. According to the teachings of the present invention, the metal gate or metal capacitor storage node/plate 309 includes a metal gate selected from the group consisting of cobalt, nickel, ruthenium, rhodium, palladium, iridium, platinum and gold. Alternatively, in one embodiment of the present invention, the metal gate or metal capacitor storage node/plate 309 includes a metallic nitride gate selected from the group consisting of titanium nitride, tantalum nitride, tungsten nitride, and molybdenum nitride.

In contrast to the previous work, the present invention utilizes p-type semiconductor or metal gates or capacitor plates with work functions larger than those of n-type doped polysilicon (4.1 eV) or the commonly used aluminum metal in MOS technology (4.1 eV). Voltages applied to the gates or plates are lower than 3.2 Volts so the primary tunneling mechanism is restricted to direct band to band tunneling (see generally, T. P. Ma et al., "Tunneling leakage current in ultrathin (<4 nm) nitride/oxide stack dielectrics," IEEE Electron Device Letters, vol. 19, no. 10, pp. 388–390, 1998).

Figure 4:
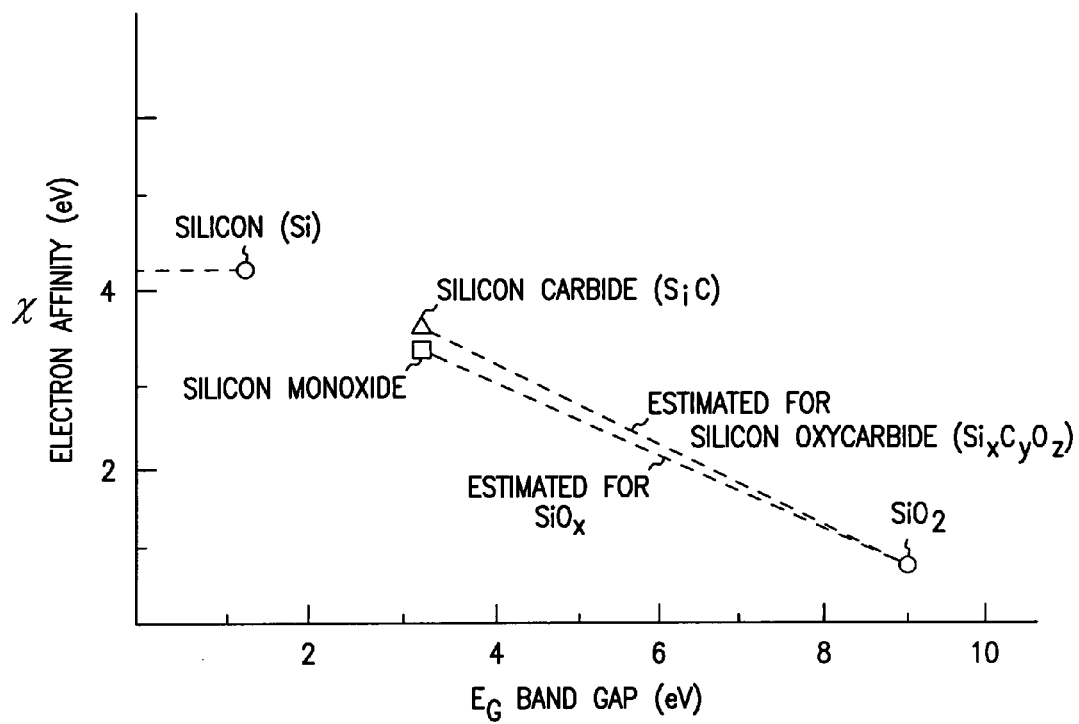
FIG. 4 is a graph plotting electron affinity versus band gap energy of silicon, carbide, and oxygen related compounds.

FIG. 4 is a graph plotting electron affinity versus band gap energy of silicon, carbide, and oxygen related compounds. As shown in FIG. 4, silicon dioxide is an insulator with a relative dielectric constant of 3.9, energy gap of approximately 9.0 eV, and electron affinity of 0.9 eV. In a conventional flash memory, electrons stored on the polysilicon floating gate see a large tunneling barrier of about 3.2 eV. This value is the difference between the electron affinities of silicon (4.1 eV) and $SiO_2$ (0.9 eV). This is a relative large barrier which requires high applied electric fields for electron injection. SiO has a dielectric constant close to that of $SiO_2$ which, as stated above, has a value near 3.9. Also, as shown in FIG. 4, SiO has a band gap of approximately 3.2 eV and an estimated electron affinity of 3.5 eV. Accordingly, as shown in FIG. 4, the x in SiOx can be varied to produce a range of electron affinities and poly-Si/a-SiOx tunneling barriers from 0.6 eV to 3.2 eV. Finally, Crystalline SiC has a band gap of ~3 eV and an electron affinity of 3.7 eV. Amorphous SiC or a-SiC and hydrogenated, amorphous a-$SiC_x$:H films have relatively low conductivity under modest applied electric fields (see generally, F. Dimichelis et al., "Doped amorphous and microcrystalline silicon carbide as wide bandgap material," Symp. On Wide Band Gap Semiconductors, Mat. Res. Soc., Pittsburgh, Pa., pp. 675–680, 1992). Amorphous-$Si_xC_yO_z$, or a-$Si_xC_yO_z$, is a wide band gap insulator with a low dielectric constant (<4), comparable to $SiO_2$ (see generally, T. Furusawa et al., "Simple reliable Cu/low-k interconnect integration using mechanically-strong low-k dielectric material: silicon-oxycarbide," Proc. IEEE int. Interconnect Technology Conf., pp. 222–224, June 2000). No measurements have been reported on the electron affinities of amorphous films of silicon oxycarbide but projections can be made based on the electron affinities and band gaps of $SiO_2$ and SiC. As shown in FIG. 4, the electron affinity of a-$Si_xC_yO_z$ should vary from that of silicon dioxide (0.9 eV) to that of the silicon carbide (3.7 eV). This means that the electron barrier between the oxycarbide and silicon (sic, the difference in electron affinities of the pure silicon dioxide and pure silicon carbide) can be varied from roughly 0.4 to 3.2 eV.

Figure 5:
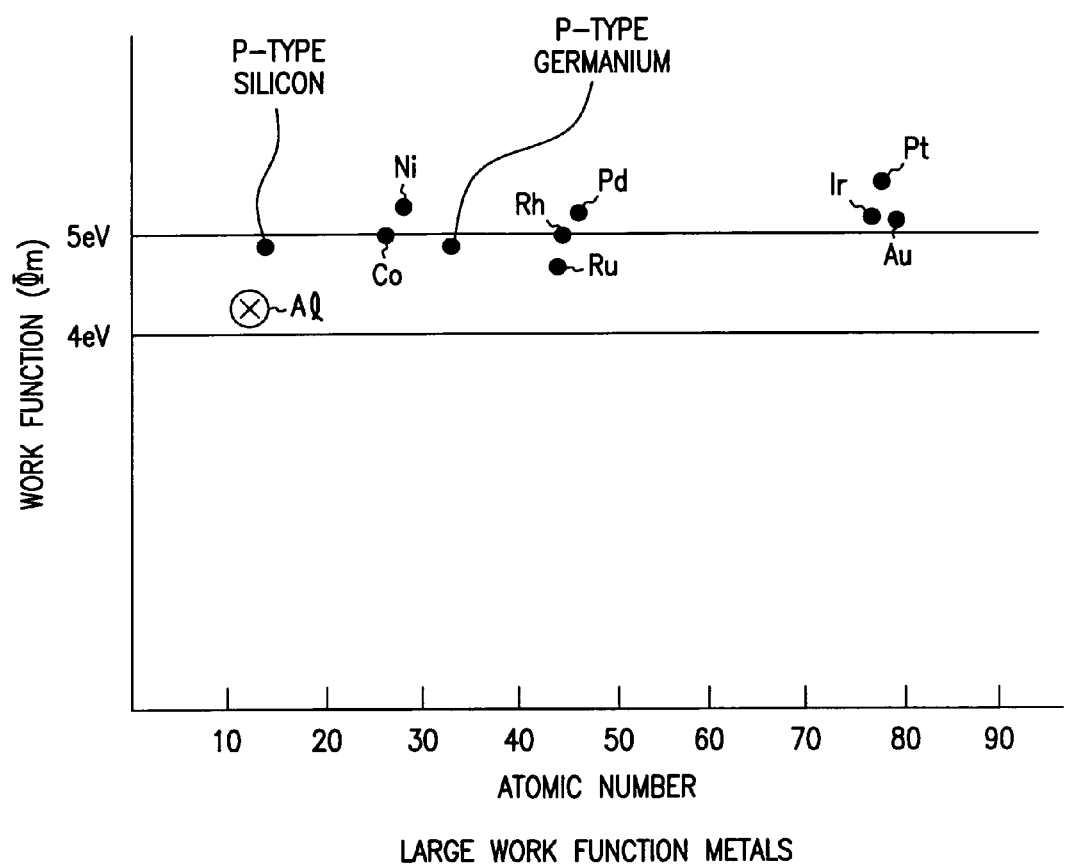
FIG. 5 is a graph plotting work function versus atomic number for large work function materials.

FIG. 5 is a graph plotting work function versus atomic number for large work function materials. FIG. 5 is provided to note the relationship of work functions to atomic number and position in the periodic table. FIG. 5 illustrates plots the work function versus atomic number of p-type silicon, aluminum (Al), p-type germanium, cobalt (Co), nickel (Ni), ruthenium (Ru), rhodium (Rh), palladium (Pd), iridium (Ir), platinum (Pt) and gold (Au).

According to the teachings of the present invention, the p-doped silicon and silicon germanium, p-doped large bandgap semiconductors, metals with large work functions, and metallic nitrides with large work functions are fabricated using conventional process techniques.

Figure 6:
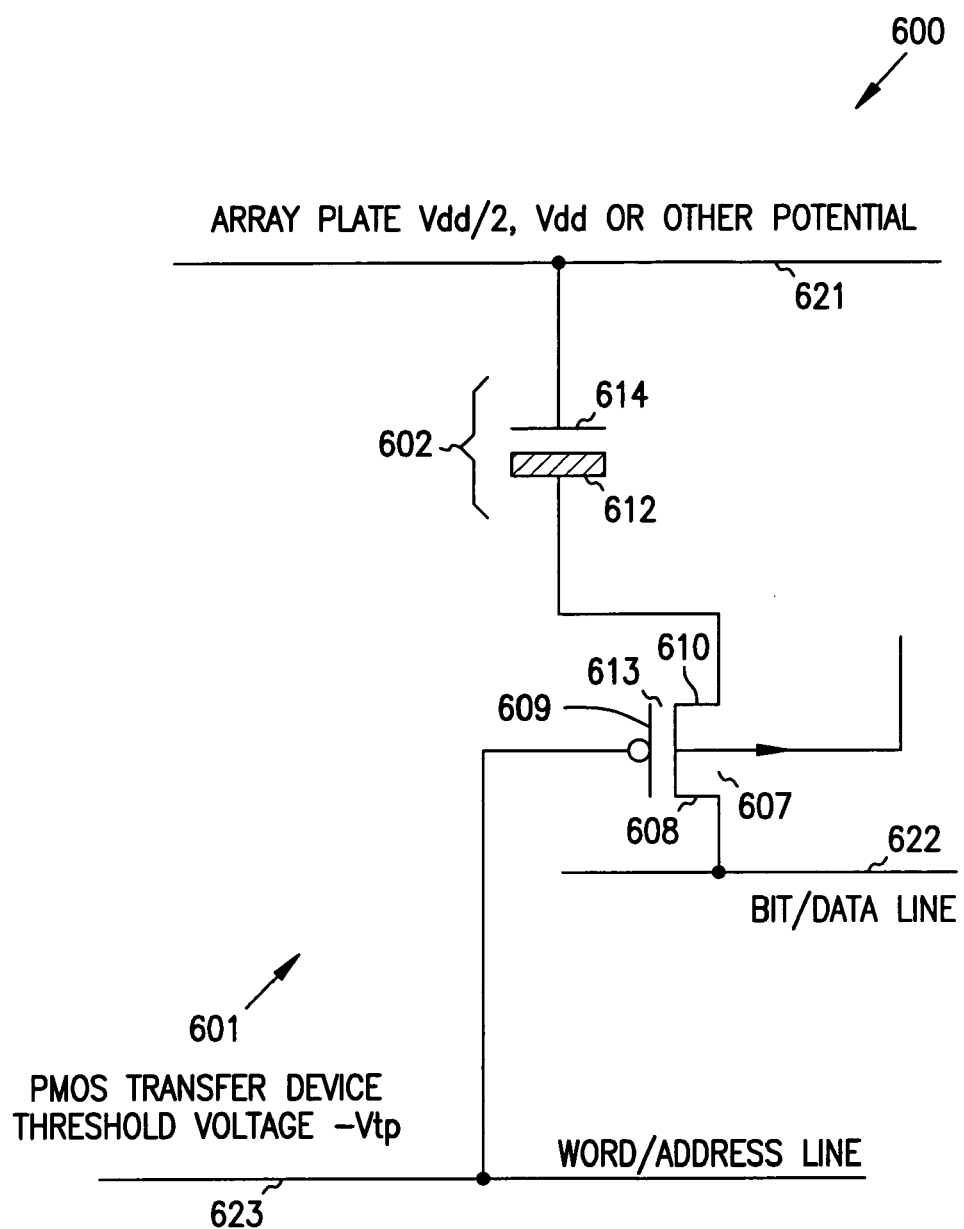
FIG. 6 illustrates one embodiment for DRAM device, or transistor according to the teachings of the present invention.

FIG. 6 illustrates one embodiment for DRAM device 600 including a transistor 601 according to the teachings of the present invention. As shown in FIG. 6, a transistor 601 is provided having a first source/drain region 608 and a second source/drain region 610. According to the embodiment shown in FIG. 6, the first 608 and the second 610 source/drain region include source/drain regions, 608 and 610, formed of a material having a large work function. A channel 607 is located between the first and the second source/drain regions, 608 and 610. A gate 609 opposes the channel 607. According to the teachings of the present invention, the gate 609 includes a gate 609 formed of a material having a large work function. A gate insulator 613 separates the gate from the channel.

Several embodiments of the present invention can be described in connection with the transistor 601 in FIG. 6. These several embodiments include a gate 609 having a large work function where the gate material is formed from the group consisting of p-type doped polycrystalline semiconductor material, large work function metals, and large work function metallic nitrides.

As stated above, one of the several embodiments of the present invention, includes the gate 609 of the transistor 601, formed of a material having a large work function, being a p-type doped polycrystalline semiconductor gate. The embodiment of the present invention, having a large work function, p-type doped polycrystalline semiconductor gate 609 can further include several subsets to this embodiment. In one subset embodiment, the large work function, p-type doped polycrystalline semiconductor gate 609 includes p-doped germanium. In another subset embodiment, the large work function, p-type doped polycrystalline semiconductor gate 609 includes p-doped silicon germanium compounds. In another subset embodiment, the large work function, p-type doped polycrystalline semiconductor gate 609 includes p-doped silicon carbide.

FIG. 6 can similarly illustrates another embodiment for DRAM device 600, or transistor 601 according to the teachings of the present invention. As shown in FIG. 6 a transistor 601 is provided having a first source/drain region 608 and a second source/drain region 610. According to the embodiment shown in FIG. 6, the first 608 and the second 610 source/drain region include source/drain regions, 608 and 610, formed of a material having a large work function. A channel 607 is located between the first and the second source/drain regions, 608 and 610. A gate 609 opposes the channel 607. According to the teachings of the present invention, the gate 609 includes a gate 609 formed of a material having a large work function. In this alternative embodiment, the gate includes a metal gate selected from the group consisting of cobalt, nickel, ruthenium, rhodium, palladium, iridium, platinum and gold. Further, the metal gate can include a metallic nitride gate selected from the group consisting of titanium nitride, tantalum nitride, tungsten nitride, and molybdenum nitride.

As shown in FIG. 6, the above described transistor 601 forms part of a memory cell 600. According to the teachings of the present invention, the memory cell is a DRAM cell. In one embodiment of the present invention, the gate insulator is less than 20 Angstroms thick.

As shown in FIG. 6, the memory cell 600 includes a capacitor 602 coupled to the second source/drain region 610 wherein a first 612 and a second plate 614 of the capacitor include first and second plates, 612 and 614 respectively, having a large work function. In one embodiment according to the teachings of the present invention, at least one of the first and the second plates, 612 and 614 include p-type polysilicon polycrystalline semiconductor plates. In this embodiment, the polycrystalline semiconductor plates, 612 and 614, are selected from the group consisting of p-doped silicon, p-doped germanium, p-doped silicon germanium compounds, p-doped silicon carbide, p-doped silicon oxycarbide compounds, p-doped gallium nitride compounds, and p-doped gallium aluminum nitride compounds.

In an alternative embodiment, at least one of the first and the second plates, 612 and 614 respectively include metal plates. In this embodiment, the metal plates include metal plates selected from the group consisting of cobalt, nickel, ruthenium, rhodium, palladium, iridium, platinum and gold. In still another embodiment of the present invention, the first and the second plates, 612 and 614 include metallic nitride plates. In this embodiment, the metallic nitride plates, 612 and 614 include metallic nitride plates selected from the group consisting of titanium nitride, tantalum nitride, tungsten nitride, and molybdenum nitride.

Figure 7:
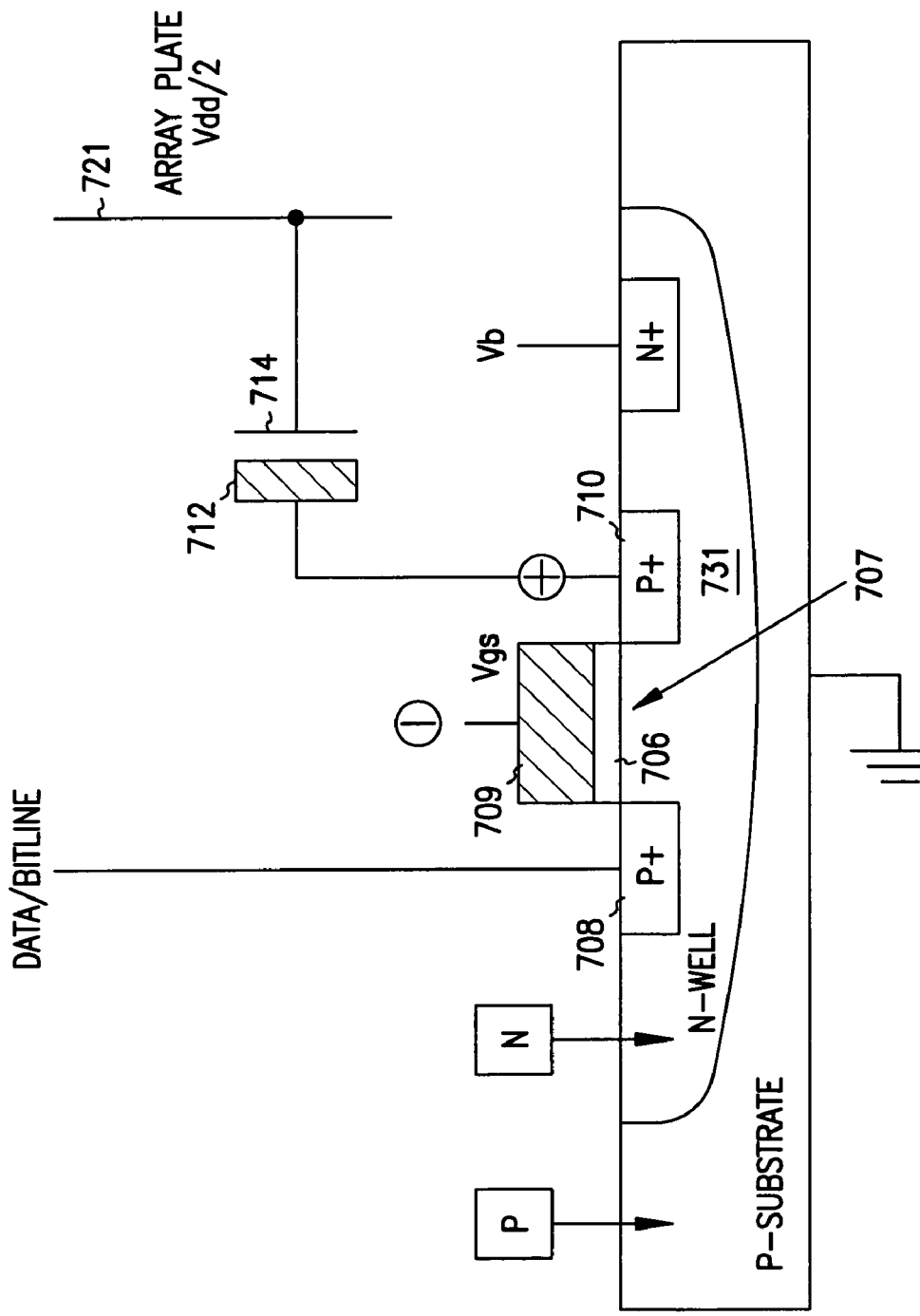
FIG. 7 illustrates a memory cell according to the teachings of the present invention.

FIG. 7 illustrates a memory cell 700 according to the teachings of the present invention. As shown in FIG. 7, memory cell 700 includes a PMOS transistor 701 formed in an n-type well 731. As shown in FIG. 7, the PMOS transistor 701 includes a first source/drain region 708, and a second source/drain region 710, where the first and the second source/drain region, 708 and 710 include source/drain regions having a large work function. A channel is 707 located between the first and the second source/drain regions, 708 and 710. A gate 709 opposes the channel 707. The gate includes a gate having a large work function. A gate insulator 706 separates the gate from the channel 707. In one embodiment, the gate insulator 706 is less than 20 Angstroms thick. As shown in FIG. 7, the memory cell 700 further includes a capacitor 703 coupled to the second source/drain region 710 wherein a first and a second plate of the capacitor, 712 and 714 includes first and second plates having a large work function.

As described above, embodiments of the present invention include first and the second p-type polysilicon polycrystalline semiconductor plates selected from the group consisting of p-doped silicon, p-doped germanium, p-doped silicon germanium compounds, p-doped silicon carbide, p-doped silicon oxycarbide compounds, p-doped gallium nitride compounds, and p-doped gallium aluminum nitride compounds.

Alternatively, the first and the second plates 712 and 714 include metal plates selected from the group consisting of cobalt, nickel, ruthenium, rhodium, palladium, iridium, platinum and gold. Alternatively still, the first and the second plates 712 and 714 include metallic nitride plates selected from the group consisting of titanium nitride, tantalum nitride, tungsten nitride, and molybdenum nitride.

Also, as described above, embodiments of the present invention include a gate 709 that includes a metal gate 709 selected from the group consisting of cobalt, nickel, ruthenium, rhodium, palladium, iridium, platinum and gold. Alternatively, the gate 709 includes a metallic nitride gate 709 selected from the group consisting of titanium nitride, tantalum nitride, tungsten nitride, and molybdenum nitride. Alternatively still, the gate 709 includes a p-type polycrystalline semiconductor gate selected from the group consisting of p-doped silicon, p-doped germanium, p-doped silicon germanium compounds, p-doped silicon carbide, p-doped silicon oxycarbide compounds, p-doped gallium nitride compounds, and p-doped gallium aluminum nitride compounds.

In one embodiment of FIG. 7, the n-type well 731 is tied to a positive voltage which is less than a power supply voltage. In an alternative embodiment of FIG. 7, the n-type well 731 is tied to a voltage which is equal to a power supply voltage. In still another embodiment of the present invention, the n-type well 731 is tied to a voltage which is greater than a power supply voltage.

Using an array plate voltage of Vcc/2 serves to reduce the electric field across the capacitor dielectric to reduce dielectric leakage currents, like tunneling and reduce the probability of dielectric breakdown. Here however if the plates are made of different materials the array plate might be tied to Vcc and the large work function of the other individual capacitor plate used to reduce the tunneling leakage currents since there would either be no electric field or voltage across the dielectric when a 1 was stored in the capacitor or only a negative potential of magnitude Vcc when a zero is stored in the capacitor. If only a negative potential difference is used then the large work function plate material will reduce the tunneling leakage current. If both the array plate and capacitor plate are made of the same large work function material then an array plate potential of Vcc/2 can be used since either plate will have a large work function and it will be difficult to cause electron tunneling from either. If the array plate is not of the same material and is not a high work function material then an intermediate value of array plate potential other than Vcc/2 might be an optimum choice. The disclosure is not so limited. For purposes of illustration we will assume the plates are of the same material and the array plate is at a potential of Vcc/2. By using capacitor plate materials with large work functions, as shown in FIGS. 6 and 7, the tunneling leakage currents of the storage capacitors can be eliminated.

The use of a PMOS transfer device with a P+ source/drain region with a large work function will result in minimal tunneling currents to the gate or eliminate tunneling leakage currents. According to the teachings of the present invention, the P+ source/drain region can be formed of any of the semiconductor materials described herein having a large work function.

Tunneling leakage from the gate can be avoided or eliminated by using gate materials with a large work function. These tunneling currents can also be reduced by biasing the n-well at a more negative potential or less than the power supply voltage Vdd; however, this can result in extra transistor subthreshold leakage since the source to n-well will be forward biased. Biasing the n-well to a potential less than Vdd will however result in less source/drain junction leakage when a zero is stored in the cell since the reverse bias between the source/drain and well will be smaller. Biasing the n-well more positive or above Vdd will result in less junction leakage tending to reduce the cell capacitor plate to voltages below Vdd when a one is stored on the capacitor plate. A variety of well potentials can thus be employed to meet different application requirements and the disclosure is not so limited by any particular n-well potential.

The use of large work function capacitor electrode plate materials, large work function gate materials, and large work function P+ source/drain regions have been described for the elimination of direct band to band tunneling leakage currents in DRAM memory cells.

Methods of the Invention

As will be understood by one of ordinary skill in the art upon reading and studying this disclosure the following methods are included as part of the scope of the present invention. These methods can be fully understood and practiced in reference to the Figures described in detail above. A first method includes a method of forming a memory cell. This method includes forming a PMOS transistor an n-type well. Forming the PMOS transistor includes forming a first and a second source/drain regions separated by a channel. Forming the first and the second source/drain regions includes forming source/drain regions having a large work function. The method further includes forming a gate opposing the channel. According to the teachings of the present invention, forming the gate includes forming a gate having a work function of greater than 4.1 eV. A gate insulator is formed separating the gate from the channel. In one embodiment, the gate insulator is formed to a thickness of less than 20 Angstroms. Finally, the method includes forming a storage device coupled to the second source/drain region. Forming the storage device includes forming a storage device having a first and a second storage node separated by a dielectric. According to the teachings of the present invention at least one of the first and the second storage nodes has a large work function. In one embodiment, the at least one storage node having a large work function includes a work function greater than 4.1 eV.

In one embodiment of the above method, forming the PMOS transistor in an n-type well includes coupling the n-type well to a positive voltage which is less than a power supply voltage. In another embodiment of the above method forming the PMOS transistor in an n-type well includes coupling the n-type well to a voltage which is equal to a power supply voltage. In yet another embodiment of the above method forming the PMOS transistor in an n-type well includes coupling the n-type well to a voltage which is greater than a power supply voltage.

Further, in one embodiment forming the first and the second storage nodes includes forming the first and the second storage nodes of the same material. In one embodiment, forming the first and the second source/drain regions having a large work function includes forming the first and the second source/drain regions with a work function greater than 4.1 eV.

In one embodiment, forming the first and the second storage nodes includes forming first and second storage nodes which include a p-type polysilicon polycrystalline semiconductor material selected from the group consisting of p-doped silicon, p-doped germanium, p-doped silicon germanium compounds, p-doped silicon carbide, p-doped silicon oxycarbide compounds, p-doped gallium nitride compounds, and p-doped gallium aluminum nitride compounds.

Alternatively, in one embodiment, forming the first and the second storage nodes includes forming the first and the second storage nodes of a metal selected from the group consisting of cobalt, nickel, ruthenium, rhodium, palladium, iridium, platinum and gold.

Alternatively still, in one embodiment, forming the first and the second storage nodes includes forming the first and the second storage nodes of a metallic nitride selected from the group consisting of titanium nitride, tantalum nitride, tungsten nitride, and molybdenum nitride.

In one embodiment, forming the gate includes forming a metal gate selected from the group consisting of cobalt, nickel, ruthenium, rhodium, palladium, iridium, platinum and gold. In another embodiment of the above method forming the gate includes forming a metallic nitride gate selected from the group consisting of titanium nitride, tantalum nitride, tungsten nitride, and molybdenum nitride. In another embodiment of the above method forming the gate includes forming a p-type polycrystalline semiconductor gate selected from the group consisting of p-doped silicon, p-doped germanium, p-doped silicon germanium compounds, p-doped silicon carbide, p-doped silicon oxycarbide compounds, p-doped gallium nitride compounds, and p-doped gallium aluminum nitride compounds.

Another method embodiment of the present invention includes a method for operating a memory cell. This method includes applying a negative voltage to a gate of a PMOS transistor formed in an n-type well. In this embodiment, the PMOS transistor includes a first source/drain region and a second source/drain region. The first and the second source/drain region include source/drain regions having a large work function. A channel is located between the first and the second source/drain regions. A gate opposes the channel. In one embodiment, the gate includes a gate having a large work function. A gate insulator separates the gate from the channel. In one embodiment, the gate insulator is less than 20 Angstroms thick. The method further includes coupling the n-type well to a positive voltage which is less than a power supply voltage. The method further includes reading a charge level of a storage device. The storage device includes a first and a second storage node. At least one of the first and the second storage nodes is formed of a material having a large work function.

According to the teachings of the present invention, coupling the n-type well to a positive voltage which is less than a power supply voltage achieves lower tunneling charge leakage from the gate.

Another method embodiment for the present invention includes a method for operating a memory cell. This method includes applying a negative voltage to a gate of a PMOS transistor formed in an n-type well. Again, the PMOS transistor includes a first source/drain region and a second source/drain region. The first and the second source/drain region include source/drain regions having a large work function. A channel located between the first and the second source/drain regions. A gate opposes the channel. In one embodiment, the gate includes a gate having a large work function. A gate insulator separates the gate from the channel. In one embodiment, the gate insulator is less than 20 Angstroms thick. The method further includes coupling the n-type well to a voltage which is equal to a power supply voltage. And, the method includes reading a charge level of a storage device. The storage device includes a first and a second storage node. In one embodiment, at least one of the first and the second storage nodes includes a storage node formed of a material having a large work function.

According to the teachings of the present invention, coupling the n-type well to a voltage which is equal to a power supply voltage achieves lower tunneling charge leakage from the gate and lower junction leakage from the second source/drain region and storage device when the storage device is not charged.

Another method embodiment of the present invention includes a method for operating a memory cell. This embodiment includes applying a negative voltage to a gate of a PMOS transistor formed in an n-type well. The PMOS transistor includes a first source/drain region and a second source/drain region. The first and the second source/drain region include source/drain regions formed of a material having a large work function. A channel is located between the first and the second source/drain regions and a gate opposes the channel. In one embodiment, the gate includes a gate having a large work function. A gate insulator separates the gate from the channel. In one embodiment, the gate insulator is less than 20 Angstroms thick. The method further includes coupling the n-type well to a voltage which is greater than a power supply voltage. The method further includes reading a charge level of a storage device. The storage device includes a first and a second storage node. In one embodiment, the first and the second storage nodes includes at least one storage node formed of a material having a large work function.

According to the teachings of the present invention, coupling the n-type well to a voltage which is greater than a power supply voltage will result in less junction leakage tending to reduce the cell capacitor plate to voltages below Vdd when a one is stored on the capacitor plate.

As such, one of ordinary skill in the art will understand upon reading this disclosure that a variety of well potentials can thus be employed to meet different application requirements and this disclosure in not so limited by any particular n-well 731 potential.

CONCLUSION

The above structures and fabrication methods have been described, by way of example and not by way of limitation, with respect to provide improved techniques for controlling tunneling currents in DRAM capacitors, cells and devices. Such improved techniques should take into power supply currents and power dissipation issues.

What is claimed is:

1. A memory cell, comprising:
a storage capacitor, including:
a first plate and a second plate separated by a dielectric; wherein at least one of the plates includes a material with a work function greater than 4.1 eV; and
an access transistor coupled to the storage capacitor, wherein the access transistor includes a gate with a work function greater than 4.1 eV.

2. The memory cell of claim 1, wherein the memory cell is a DRAM cell.

3. The memory cell of claim 1, wherein the dielectric has an equivalent oxide thickness less than 20 angstroms.

4. The memory cell of claim 1, wherein the access transistor includes a PMOS access transistor.

5. The memory cell of claim 4, wherein a gate of the PMOS access transistor includes a material with a work function greater than 4.1 eV.

6. A memory cell, comprising:
a storage capacitor, including:
a first plate and a second plate separated by a dielectric; wherein at least one of the plates is formed from a metal with a work function greater than 4.1 eV; and
an access transistor coupled to the storage capacitor, wherein the access transistor includes a gate with a work function greater than 4.1 eV.

7. The memory cell of claim 6, wherein the metal is cobalt.

8. The memory cell of claim 6, wherein the metal is nickel.

9. The memory cell of claim 6, wherein the metal is ruthenium.

10. The memory cell of claim 6, wherein the metal is rhodium.

11. The memory cell of claim 6, wherein the metal is palladium.

12. The memory cell of claim 6, wherein the metal is iridium.

13. The memory cell of claim 6, wherein the metal is platinum.

14. The memory cell of claim 6, wherein the metal is gold.

15. A memory cell, comprising:
a storage capacitor, including:
a first plate and a second plate separated by a dielectric; wherein at least one of the plates includes a metal nitride with a work function to substantially limit electron tunneling to band-to-band tunneling; and
an access transistor coupled to the storage capacitor, wherein the access transistor includes a gate with a work function to substantially limit electron tunneling to band-to-band tunneling.

16. The memory cell of claim 15, wherein the metal nitride is titanium nitride.

17. The memory cell of claim 15, wherein the metal nitride is tantalum nitride.

18. The memory cell of claim 15, wherein the metal nitride is tungsten nitride.

19. The memory cell of claim 15, wherein the metal nitride is molybdenum nitride.

20. A memory cell, comprising:
a storage capacitor, including:
a first plate and a second plate separated by a dielectric; wherein at least one of the plates includes a p-doped material with a work function to substantially limit electron tunneling to band-to-band tunneling; and
an access transistor coupled to the storage capacitor, wherein the access transistor includes a gate with a work function to substantially limit electron tunneling to band-to-band tunneling.

21. The memory cell of claim 20, wherein the p-doped material is p-doped silicon.

22. The memory cell of claim 20, wherein the p-doped material is p-doped germanium.

23. The memory cell of claim 20, wherein the p-doped material is p-doped silicon germanium.

24. The memory cell of claim 20, wherein the p-doped material is p-doped silicon carbide.

25. The memory cell of claim 20, wherein the p-doped material is p-doped silicon oxycarbide.

26. The memory cell of claim 20, wherein the p-doped material is p-doped gallium nitride.

27. The memory cell of claim 20, wherein the p-doped material is p-doped gallium aluminum nitride.

28. A dynamic random access memory device comprising:
an array of memory cells, wherein the memory cells include:
a storage capacitor, including:
a first plate and a second plate separated by a dielectric; wherein at least one of the plates includes a material with a work function to substantially eliminate Fowler-Nordheim electron tunneling;
access transistors coupled to the storage capacitors of the memory cells, wherein the access transistors include a gate with a work function to substantially eliminate Fowler-Nordheim electron tunneling; and
sensing circuitry coupled to the memory cells.

29. The dynamic random access memory device of claim 28, wherein both the first plate and the second plate include a metal selected from a group consisting of cobalt, nickel, ruthenium, rhodium, palladium, iridium, platinum, and gold.

30. The dynamic random access memory device of claim 28, wherein both the first plate and the second plate include a metal nitride selected from a group consisting of titanium nitride, tantalum nitride, tungsten nitride, and molybdenum nitride.

31. The dynamic random access memory device of claim 28, wherein both the first plate and the second plate include a p-doped material selected from a group consisting of p-doped silicon, p-doped germanium, p-doped silicon germanium, p-doped silicon carbide, p-doped silicon oxycarbide, p-doped gallium nitride, and p-doped gallium aluminum nitride.

32. The dynamic random access memory device of claim 28, wherein the access transistors include PMOS access transistors.

33. The dynamic random access memory device of claim 32, wherein gates of the PMOS access transistors include a material with a work function greater than 4.1 eV.

34. A dynamic random access memory device comprising:
an array of memory cells, wherein the memory cells include:
a storage capacitor, including:
a first plate and a second plate separated by a capacitor dielectric;

wherein at least one of the plates includes a material with a work function greater than 4.1 eV;

a number of PMOS access transistors coupled to the storage capacitors of the memory cells, wherein the PMOS access transistors include:
  a first source/drain region;
  a second source/drain region;
  a channel region coupled between the first and second source/drain regions; and
  a gate located over the channel region and separated from the channel region by a gate dielectric, wherein the gate includes a material with a work function greater than 4.1 eV, wherein the gate dielectric has an equivalent oxide thickness of less than 20 angstroms.

35. The dynamic random access memory device of claim 34, wherein both the first plate and the second plate of the storage capacitor include a material with a work function greater than 4.1 eV.

36. The dynamic random access memory device of claim 34, wherein the capacitor dielectric has an equivalent oxide thickness of less than 20 angstroms.

37. The dynamic random access memory device of claim 34, wherein the gate material includes a metal selected from a group consisting of cobalt, nickel, ruthenium, rhodium, palladium, iridium, platinum, and gold.

38. The dynamic random access memory device of claim 34, wherein the gate material includes a metal nitride selected from a group consisting of titanium nitride, tantalum nitride, tungsten nitride, and molybdenum nitride.

39. The dynamic random access memory device of claim 34, wherein the gate material includes a p-doped material selected from a group consisting of p-doped silicon, p-doped germanium, p-doped silicon germanium, p-doped silicon carbide, p-doped silicon oxycarbide, p-doped gallium nitride, and p-doped gallium aluminum nitride.

40. A method of operating a memory cell, comprising:
  switching an access transistor to place a charge on a storage capacitor;
  retaining the charge in a plate of the capacitor, wherein at least one plate of the capacitor includes a material having a work function greater than 4.1 eV; and
  operating the memory cell at a voltage substantially below Fowler-Nordheim tunneling voltages.

41. The method of claim 40, further including preventing charge leakage through the access transistor wherein a gate of the transistor is formed from a material having a work function greater than 4.1 eV.

42. The method of claim 40, wherein switching an access transistor includes switching a p-type access transistor.

43. The method of claim 40, wherein retaining the charge includes retaining a charge in the storage capacitor wherein both plates of the capacitor are formed from a material having a work function greater than 4.1 eV.

* * * * *

UNITED STATES PATENT AND TRADEMARK OFFICE
CERTIFICATE OF CORRECTION

PATENT NO. : 7,235,837 B2 Page 1 of 1
APPLICATION NO. : 11/267009
DATED : June 26, 2007
INVENTOR(S) : Forbes et al.

It is certified that error appears in the above-identified patent and that said Letters Patent is hereby corrected as shown below:

On The Title Page, Item (56)
On page 2, under "Other Publications", line 14, delete "Semiconducors" and insert -- Semiconductors --, therefor.

On The Title Page, Item (56)
On page 2, under "Other Publications", line 10, after "Proc" delete "," and insert -- . --, therefor.

In column 1, line 26 (Approx.), delete "k." and insert -- K. --, therefor.

In column 1, line 43 (Approx.), delete "(FETS)" and insert -- (FETs) --, therefor.

In column 3, line 59, delete "Fowler-Nordhiem" and insert -- Fowler-Nordheim --, therefor.

In column 5, lines 35-36, delete "molydenum" and insert -- molybdenum --, therefor.

Signed and Sealed this

Twenty-third Day of October, 2007

JON W. DUDAS
*Director of the United States Patent and Trademark Office*